(12) United States Patent
Sawdai et al.

(10) Patent No.: US 7,038,256 B1
(45) Date of Patent: May 2, 2006

(54) LOW TURN-ON VOLTAGE, NON-ELECTRON BLOCKING DOUBLE HBT STRUCTURE

(75) Inventors: Donald J. Sawdai, Redondo Beach, CA (US); Augusto L. Gutierrez-Aitken, Redondo Beach, CA (US); Tsung-Pei Chin, Gardena, CA (US)

(73) Assignee: Northrop Grumman Corp., Los Angeles, CA (US)

( * ) Notice: Subject to any disclaimer, the term of this patent is extended or adjusted under 35 U.S.C. 154(b) by 0 days.

(21) Appl. No.: 11/003,575

(22) Filed: Dec. 3, 2004

(51) Int. Cl.
*H01L 31/0328* (2006.01)
(52) U.S. Cl. ..................... 257/197; 257/198
(58) Field of Classification Search .............. 257/197, 257/198, 200, 201
See application file for complete search history.

(56) References Cited

U.S. PATENT DOCUMENTS

| | | | |
|---|---|---|---|
| 6,399,969 B1 * | 6/2002 | Twynam | 257/191 |
| 6,459,103 B1 * | 10/2002 | Liu et al. | 257/197 |
| 6,670,653 B1 * | 12/2003 | Micovic et al. | 257/197 |
| 6,727,153 B1 * | 4/2004 | Chow | 438/312 |
| 6,756,615 B1 * | 6/2004 | Yoshioka et al. | 257/198 |
| 6,762,480 B1 * | 7/2004 | Moll et al. | 257/592 |
| 6,768,141 B1 * | 7/2004 | Bahl et al. | 257/197 |
| 6,903,387 B1 * | 6/2005 | Hase | 257/197 |

OTHER PUBLICATIONS

Matine, N.; Dvorak, M.W.; Xu, X.G.; Watkins, S.P.; Bolognesi, C.I. "InP/GaAsSb/InP double heterojunction bipolar transistors with high cut-off frequencies and breakdown voltages," Indium Phosphide and Related Materials, 1999, pp. 179-182.

William R. Frensley, "Heterostructure and Quantum Well Physics," Chapt. 1 of Heterostructures and Quantum Devices, Frensley, W.R. et al. editors, a volume of "VLSI Electronics: Microstructure Science," Academic Press, San Diego, CA, published Mar. 25, 1994.

Mark Lundstrom, "Notes on Heterostructure Fundamentals," School of Elect. and Comp. Eng., Purdue Univ., W. Lafayette, Indiana, Aug. 29, 1997.

Gutierrez-Aitken, A.; Oki, A.K.; Sawdai, D.; Kaneshiro, P.C.; Grossman, W.; Kim, W.; Leslie, G.; Block, T.; Wojtowicz, M.; Chin, P.; Yamada, F.; Steit, D.C. "InP HBT Production Process," pub. by GaAs MANTECH Inc., 2001.

* cited by examiner

*Primary Examiner*—Sara Crane
(74) *Attorney, Agent, or Firm*—Patti & Brill, LLC

(57) ABSTRACT

A double heterojunction bipolar transistor structure having desirable properties of a low base-emitter turn-on voltage and no electron blocking discontinuities in the base-collector junction. These properties are achieved by selecting base, emitter and collector materials to provide a bandgap profile that exhibits abrupt transitions at the heterojunctions, such that both abrupt transitions are due to transitions in the valence band edge of the bandgap, but not in the conductive band edge of the bandgap.

3 Claims, 3 Drawing Sheets

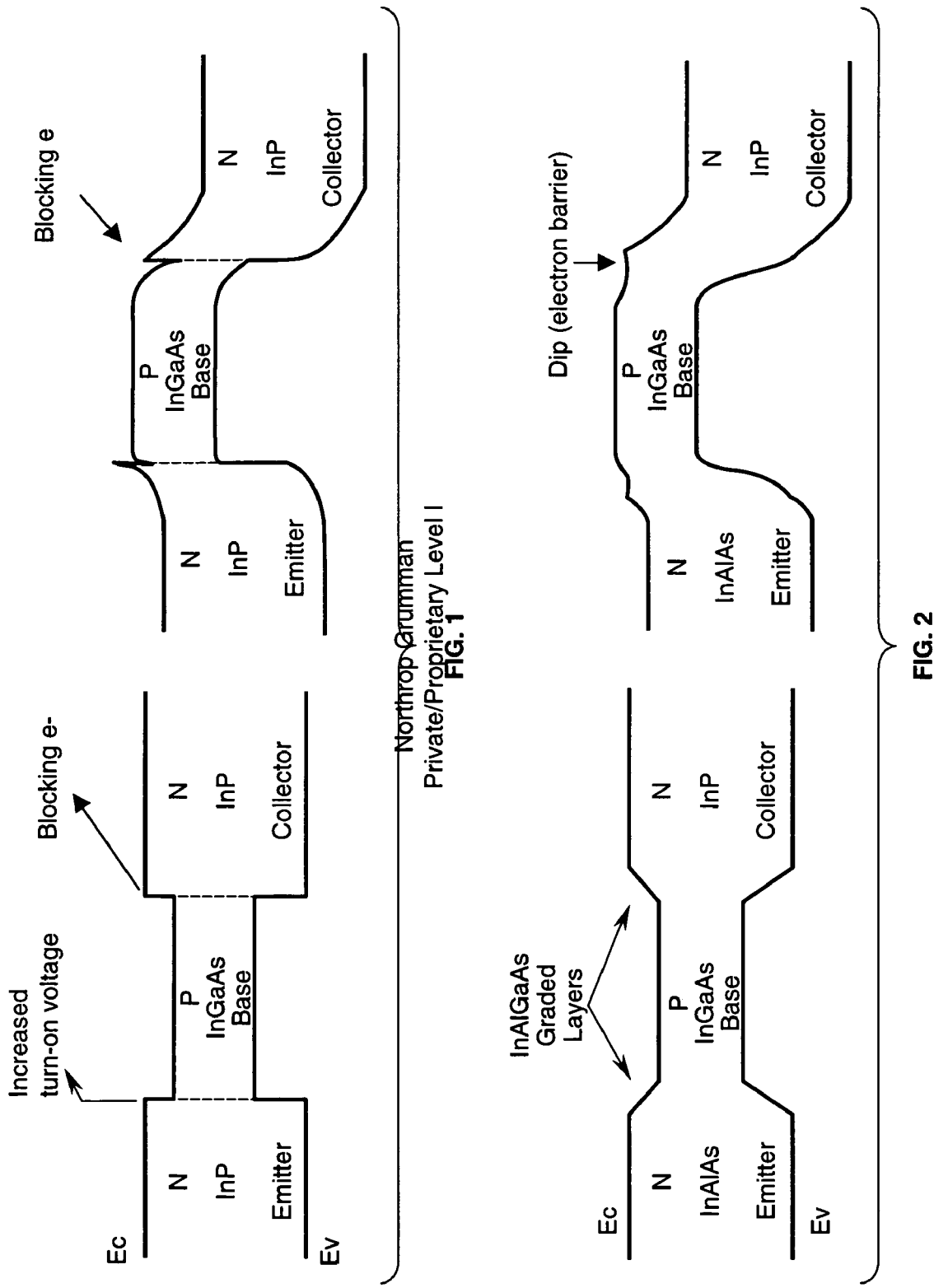

US 7,038,256 B1

LOW TURN-ON VOLTAGE, NON-ELECTRON BLOCKING DOUBLE HBT STRUCTURE

BACKGROUND OF THE INVENTION

This invention relates generally to heterojunction bipolar transistors (HBTs) and, more particularly, to double HBT structures and techniques for achieving desirable characteristics in such structures. Briefly, by way of background, a heterostructure may be defined as a semiconductor structure in which the chemical composition varies with position in the structure. The simplest-heterostructure has a single heterojunction, i.e., a single interface within a semiconductor crystal across which the chemical composition changes. Examples include junctions between gallium antimony (GaSb) and indium arsenide (InAs) semiconductors, and junctions between indium phosphide (InP) and indium gallium arsenide (InGaAs). A common heterostructure with two heterojunctions is referred to as a double HBT, or DHBT. The electrical performance characteristics of the DHBT are highly dependent on the nature of the heterojunctions in the device.

In theory, an ideal heterojunction consists of a semiconductor crystal in which there exists a plane across which the identity of the atoms participating in the crystal changes abruptly. In practice, some crystal systems provide a close approximation of the atomically abrupt interface. In other crystals, there may be non-abrupt interfaces including crystalline defects near the interface. A semiconductor heterojunction interface may be made non-abrupt by design, by gradually varying the chemical composition of one of the materials near the interface. Such interfaces are referred to as graded heterojunctions.

An important concept in the theory and design of HBT structures is the energy band structure. In particular, it is important to define the concepts and inter-relationships of "conduction band," "valence band" and "bandgap." In semiconductors, the conduction band is the first empty energy band into which electrons must be promoted to contribute to conduction. The valence band is the energy band containing electrons that are shared in the process of valence bonding of atoms. In semiconductors, the valence band is full and the electrons in it are unable to contribute significantly to conduction, without being excited to the level of the conduction band. The bandgap is a band of "forbidden" energies between the top of the valence band and bottom of the conduction band. In general, electrons do not have stable states with energies within the bandgap. A useful tool for predicting and analyzing HBT performance is the energy band diagram, which plots the extent of the bandgap energy versus position in the device. The upper edge of the bandgap (the bottom of the conduction band) is usually referred to as having an energy $E_C$, measured with respect to a common energy reference, and lower edge of the bandgap (the top of the valence band) is usually referred to as having an energy $E_V$, with respect to the same energy reference.

In the materials on each side of a heterojunction, the bandgaps are usually different. Therefore, the energy of charge carriers at at least one of the edges of the bandgap must change as those carriers pass through the heterojunction. These discontinuities may exist in the conduction band, the valence band, or both, depending on the manner in which these bands align or misalign at the heterojunction. Heterojunction band alignment is sometimes categorized in the technical literature as being of Type I, Type II or Type III. A Type I heterojunction is one in which the bandgap of one of the materials is completely contained within the bandgap of the other. This is sometimes referred to as a "straddling" relationship. In a Type II heterojunction, one bandgap partially overlaps the other, which is sometimes referred to as a "staggered" relationship. In a Type III heterojunction, the adjacent bandgaps do not overlap at all, which is sometimes referred to as a "broken-gap" relationship.

FIGS. 1–3 are examples of bandgap diagrams for prior art DHBT structures. FIG. 1 is a pair of bandgap diagrams for a Type I abrupt junction npn DHBT structure in which the emitter and collector materials are both indium phosphide (InP) and the base material is indium gallium arsenide (InGaAs). The left-hand portion of the bandgap diagram shows the bandgaps of the materials when they are isolated, and the right-hand portion of the diagram shows the bandgaps of the materials when they have been "joined" at the two heterojunctions. It will be understood, of course, that there is no "joining" step as such, because the entire structure is formed as a single crystal by an epitaxial process. In each case, the horizontal axis plots position within the device, measured in a direction normal to the heterojunction interfaces.

When the materials on each side of a heterojunction are "joined," charge carriers will flow across the junction, building space charges until the Fermi energy is the same everywhere in the material. At positions far removed from the junction, the bandgap diagram remains unchanged. To represent this condition in a bandgap diagram, one first aligns the two Fermi energy levels (not shown in the figures, but always falling somewhere within the bandgap). Then, one must adjust the edges of the bandgap to accommodate the new alignment, but maintaining the bandgap of each material constant. As illustrated in FIG. 1, in some cases it is impossible to do this without introducing a discontinuity or cusp in either the conduction band edge or the valence band edge. The cusp at the base-emitter junction results in an increased base-emitter turn-on voltage because electrons need to have a certain energy before being transmitted across the junction. The cusp at the base-collector junction results in an electron blocking effect, preventing electrons from being transported from the base region into the collector at small base-collector voltage. Both of these phenomena have undesirable effects on device performance, because they require a large bias voltage at both the emitter-base and base-collector junctions.

Using graded junctions in a Type I device is depicted in FIG. 2. In this structure, the emitter material is indium aluminum arsenide (InAlAs), the base material is indium gallium arsenide (InGaAs) and the collector material is indium phosphide (InP). The gradual material transitions in the emitter-base junction lead to a lower turn-on voltage, and the graded base-collector junction reduces the electron blocking effect. However, the resulting bandgap diagram has a significant dip in the conduction band of the collector, blocking some electrons that could otherwise be passing to the collector output. Therefore, the major drawback of this device structure is that electron blocking from the base to the collector still occurs at small base-emitter bias voltages. In effect, the use of graded junctions reduces the magnitudes of the cusps or discontinuities, but they are still present to some degree.

A Type II heterojunction HBT structure is depicted in FIG. 3. The emitter material is indium phosphide (InP), the base material is gallium arsenide antimonide (GaAsSb) and the collector material is indium phosphide (InP). This choice of base material raises the base conduction band above that of the emitter and collector conduction band levels. This allows electrons to pass more freely from the base to the collector. However, the drawbacks are the difficulty of fabricating abrupt InP/GaAsSb heterojunctions and the increase in the emitter-base turn-on voltage, so that a large emitter-base bias voltage must be used.

It will be appreciated from the foregoing that all of these described DHBT structures of the prior art have significant disadvantages. Accordingly, a DHBT structure without these disadvantages is still needed. The present invention satisfies this need.

SUMMARY OF THE INVENTION

The present invention resides in a double heterojunction bipolar transistor (DHBT) structure having a desirable bandgap profile that avoids the problems of the prior art. Briefly, and in general terms, the heterojunction bipolar transistor structure of the invention comprises a substrate; a semiconductor collector layer formed over the substrate; a semiconductor base layer formed over the collector layer; and a semiconductor emitter layer formed over the base layer. A base-emitter heterojunction is formed between the base layer and the emitter layer, and a base-collector heterojunction is formed between the base layer and the collector layer. The structure has a bandgap profile defined by a conduction band edge and a valence band edge. The bandgap profile when the base layer, emitter layer and collector layer are considered isolated makes an abrupt transition at the base-emitter heterojunction and at the base-collector heterojunction, and the abrupt transition is in each case defined by an abrupt transition in the valence band edge but not in the conduction band edge. The bandgap profile when the structure layers are considered to be joined provides for a reduced base-emitter turn-on voltage and no electron blocking at the base-collector layer.

More specifically, the emitter layer and the collector layer are of n-type indium phosphide (InP); and the base layer is of p-type indium aluminum gallium arsenide (InAlGaAs), formulated to provide the desired bandgap profile that has practically no junction transitions in its conduction band edge. In the presently preferred embodiment of the invention, the base layer is formulated as $In_{0.53}(Al_{0.42}Ga_{0.58})_{0.47}As$ to provide the desired bandgap profile.

It will be appreciated from the foregoing that the present invention provides a significant advance in the field of DHBT structures. In particular, the invention provides a DHBT structure with a low base-emitter turn-on voltage and no electron blocking in the base-collector junction. Other aspects and advantages of the invention will become apparent from the following more detailed description of the invention, taken in conjunction with the accompanying drawings.

BRIEF DESCRIPTION OF THE DRAWINGS

FIG. 1 is a bandgap diagram for a Type I abrupt junction DHBT of the prior art.

FIG. 2 is a bandgap diagram for a Type I graded junction DHBT of the prior art.

DETAILED DESCRIPTION OF THE INVENTION

Figure 3:
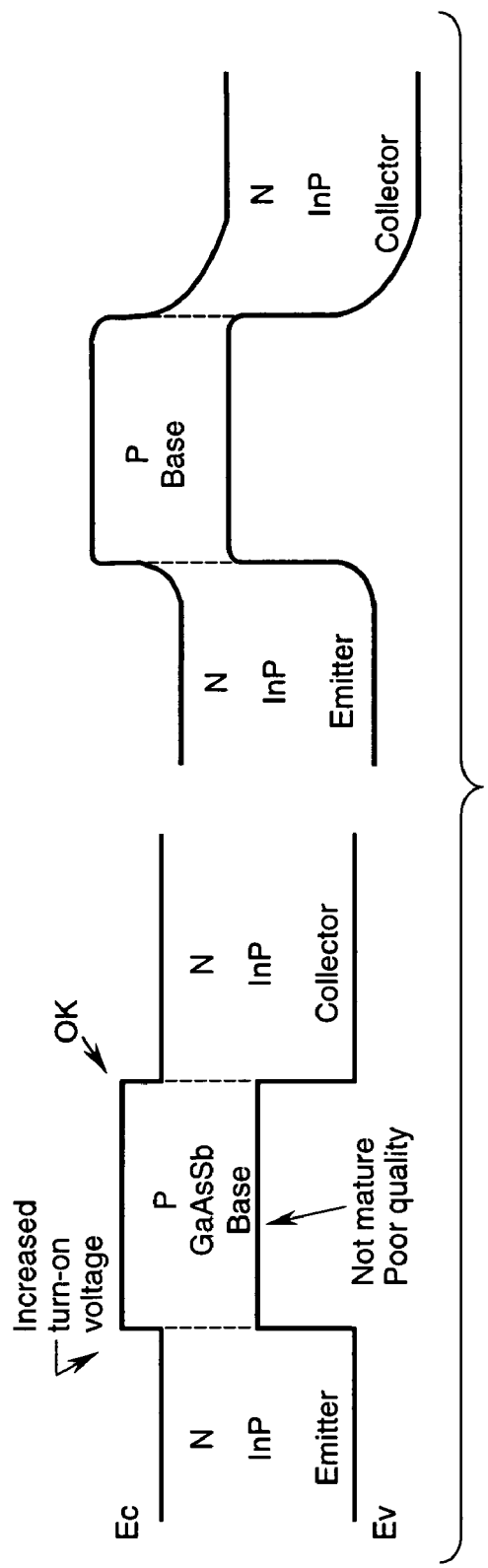
FIG. 3 is a bandgap diagram for a Type II abrupt junction DHBT of the prior art.

As shown in the drawings for purposes of illustration, the present invention is concerned with double heterojunction bipolar transistor (DHBT) structures. As discussed above in the background section of this specification, important characteristics of DHBT structures can be explained and understood by constructing bandgap diagrams or profiles, which depict the conduction band and valence band energy levels at various locations throughout the structure. In particular, these diagrams show how the bandgap varies through the heterojunctions of the structures. As also discussed above, prior art DHBT structures such as those illustrated in FIGS. 1–3 have significant disadvantages. In particular, the Type I abrupt junction structure of FIG. 1 has a relatively large base-emitter turn-on voltage and blocks full electron flow through the base-collector junction. A relatively large bias voltage is, therefore, needed at both junctions. The graded junction Type I structure of FIG. 2 reduces the effect of these problems but still provides significant base-emitter electron blocking, requiring a large bias voltage at the base-collector junction. The Type II abrupt junction structure of FIG. 3 avoids electron blocking at the base-collector junction but still requires a large turn-on voltage at the base-emitter junction and is difficult to grow with good quality.

In accordance with the present invention, a DHBT structure is provided with a bandgap profile that has abrupt junction discontinuities only in the valence band edge of the bandgap, while the conduction band edge of the bandgap is maintained at a relatively constant level through both heterojunctions.

Figure 4:
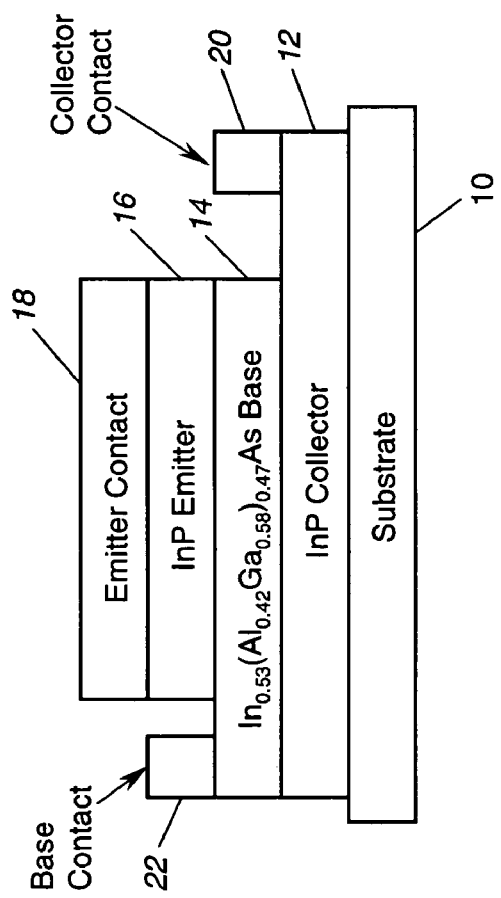
FIG. 4 is a cross-sectional view of a typical DHBT structure.

For purposes of illustration, FIG. 4 shows a typical cross section of a DHBT structure. Beginning with a suitable semiconductor substrate 10, an n-type collector layer 12 is formed epitaxially, specifically of indium phosphide (InP). A p-type base layer 14 is grown on the collector layer 12, and an n-type emitter layer 16 is grown over the base layer. Electrical contact is made with the device through an emitter contact layer 18, a collector contact layer 20 and a base contact layer 22. Preferably, the emitter layer 16 is also of indium phosphide and the base includes indium aluminum gallium arsenide in the formulation $In_{0.53}(Al_{0.42}Ga_{0.58})_{0.47}As$. Epitaxial growth of the layers shown in FIG. 4 may be performed by any of a number of specific semiconductor fabrication techniques well known in the art.

Figure 5:
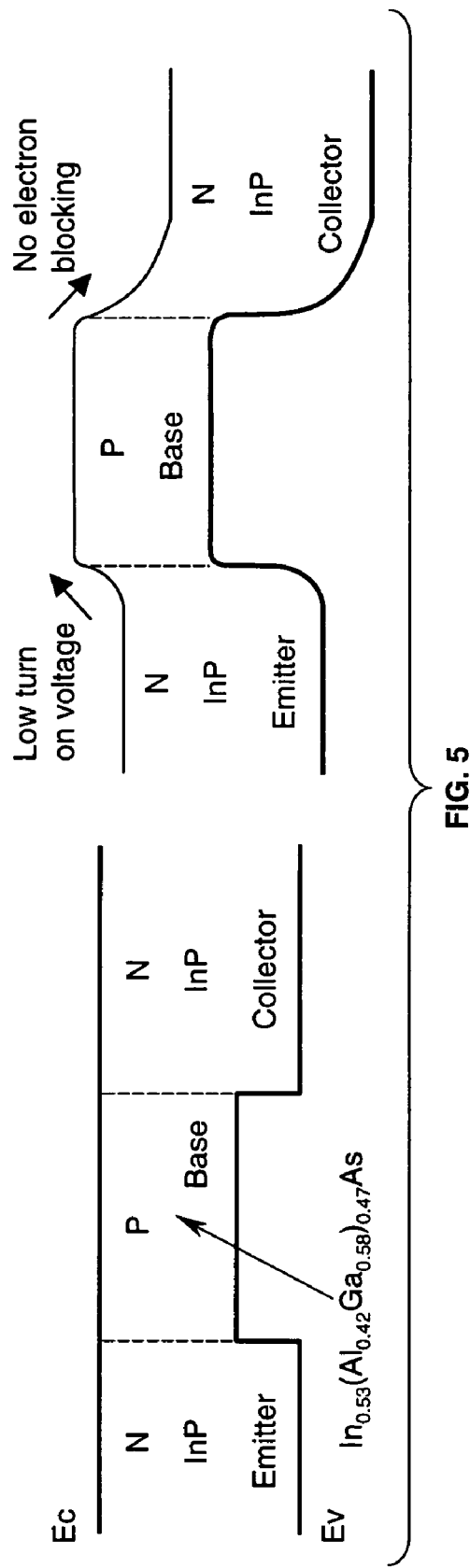
FIG. 5 is a bandgap diagram of an abrupt junction DHBT in accordance with the present invention.

The bandgap diagram for the structure of the invention is shown in FIG. 5. It will be noted from the left-hand portion of FIG. 5 that the conduction band edge of the bandgap is essentially uniform through the two heterojunctions of the structure when the emitter, base and collector are considered to be isolated. The valence band edge of the bandgap shows an abrupt energy increase through the junction from emitter to base, and an equivalent abrupt decrease through the junction from base to collector. The bandgap profile in the "joined" structure, shown on right-hand portion of the figure, shows a relatively small smooth step up in the conduction band in the transition from emitter to base, resulting in a low turn-on voltage, and a smooth drop in the conduction band in the transition from base to collector. There are no cusps or discontinuities at either of the transitions, and no electron blocking effect at the base-collector junction, which allows for highly efficient operation at small bias voltages. In effect, the structure of the invention combines the advantages of the two Type I structures shown in FIGS. 1 and 2. Moreover, the device is simpler to fabricate than graded junction devices because selective etchants are available for both InP and InAlGaAs materials. The device is also simpler to grow than the Type II structure shown in FIG. 3 due to practical difficulties that arise when growing GaAsSb layers and InP/GaAsSb heterojunctions.

It will be appreciated from the foregoing that the present invention represents a significant advance in the field of DHBT structures. In particular, the invention provides a device with the desirable characteristics of a low base-emitter turn-on voltage and no electron blocking near the base-collector junction. It will also be appreciated that, although a specific embodiment of the invention has been described in detail for purposes of illustration, various modifications may be made without departing from the spirit and scope of the invention. Accordingly, the invention should not be limited except as by the appended claims.

The invention claimed is:

1. A heterojunction bipolar transistor structure, comprising:
   a substrate;
   a semiconductor collector layer formed over the substrate;
   a semiconductor base layer formed over the collector layer; and
   a semiconductor emitter layer formed over the base layer;
   wherein a base-emitter heterojunction is formed between the base layer and the emitter layer, and a base-collector heterojunction is formed between the base layer and the collector layer;
   wherein the structure has a bandgap profile defined by a conduction band edge and a valence band edge;
   wherein the bandgap profile when the base layer, emitter layer and collector layer are considered isolated makes an abrupt transition at the base-emitter heterojunction and at the base-collector heterojunction, and the abrupt transition is in each case defined by an abrupt transition in the valence band edge but not in the conduction band edge; and
   wherein the bandgap profile when the structure layers are considered to be joined, provides for a reduced base-emitter turn-on voltage and no electron trapping at the base-collector heterojunction.

2. A heterojunction bipolar transistor structure as defined in claim 1, wherein:
   the emitter layer and the collector layer are of n-type indium phosphide (InP); and
   the base layer is of p-type indium aluminum gallium arsenide (InAlGaAs).

3. A heterojunction bipolar transistor structure as defined in claim 2, wherein the base layer is formulated as $In_{0.53}(Al_{0.42}Ga_{0.58})_{0.47}As$ to provide the desired bandgap profile.

* * * * *